United States Patent
Abe

[11] Patent Number: 5,838,697
[45] Date of Patent: Nov. 17, 1998

[54] BIT ERROR COUNTING METHOD AND COUNTING TECHNICAL FIELD

[75] Inventor: Masami Abe, Tokyo, Japan

[73] Assignee: Oki Electric Industry Co., Ltd., Tokyo, Japan

[21] Appl. No.: 848,236

[22] Filed: Apr. 29, 1997

Related U.S. Application Data

[62] Division of Ser. No. 564,353, Dec. 15, 1995, abandoned.

[51] Int. Cl.[6] .......................... G06F 11/10; H03M 13/12
[52] U.S. Cl. ..................... 371/43.8; 371/5.1; 371/43.6; 371/43.7; 375/262; 375/341
[58] Field of Search ................... 371/5.1, 43–45, 371/43.4, 43.6, 43.7, 43.8; 375/225, 229, 262, 265, 341, 346

[56] References Cited

U.S. PATENT DOCUMENTS

| | | | |
|---|---|---|---|
| 5,291,524 | 3/1994 | Itakura et al. | 375/341 |
| 5,303,263 | 4/1994 | Shoji et al. | 375/224 |
| 5,398,254 | 3/1995 | Miya et al. | 371/43.7 |

FOREIGN PATENT DOCUMENTS

| | | |
|---|---|---|
| 58-206252 | 12/1983 | Japan . |
| 61-338 | 1/1986 | Japan . |
| 61-121622 | 6/1986 | Japan . |
| 62-159519 | 7/1987 | Japan . |
| 63-6173 | 2/1988 | Japan . |
| 1-235073 | 9/1989 | Japan . |

OTHER PUBLICATIONS

Q0256, Technical Data Sheet, k=7 Multi–Code Rate Viterbi Decoder, Jun. 1990.

*Primary Examiner*—Emmanuel L. Moise
*Attorney, Agent, or Firm*—Rabin & Champagne, P.C.

[57] ABSTRACT

An error detecting device and method for use when applying the Viterbi decoding to an inputted signal, when it is necessary to derive the number of errors included in a decoded signal. A value of a path metric derived upon the Viterbi decoding is read out and outputted as the number of errors. Two kinds of decoding devices, each reading out a value of a path metric and outputting this value as the number of errors, are provided for a sound signal and an FACCH signal. A signal is inputted to both devices for decoding, respectively. The numbers of errors derived from both devices are compared, and it is judged based on a result of the comparison, whether the inputted signal is the sound signal or the FACCH signal.

13 Claims, 11 Drawing Sheets

BIT ERROR COUNTING METHOD AND COUNTING TECHNICAL FIELD

This is a Division of National Stage application Ser. No. 08/564,353, filed Dec. 15, 1995, now abandoned, which was the National Stage Internation Application No. PCT/JP93/00830 filed Jun. 21, 1993.

TECHNICAL FIELD

The present invention relates to a method of and a device for counting errors of a signal in the digital communication system, and particularly, to a method of and a device for counting errors of a signal per bit in the system where an error correction is performed using the Viterbi decoding process.

BACKGROUND ART

The background art highly associated with the present application is shown, for example, in DSP Q0256 Technical Data Sheet p. 13, and 15–16, Qualcom Company. In this literature, an example of a technique is disclosed, which realizes 9 process, performed by hardware, for counting signal errors that occur when a signal encoded by the convolutional encoding is transmitted from a transmitter side, the counting process being performed during a process for restoring the original signal using Viterbi decoding at a receiver side.

In the disclosed technique, a Viterbi decoding section 901 at a receiver side tries to perform the same process as is performed at a transmitter side so as to compare the result with a signal actually sent from the transmitter side to detect an error. FIG. 9 shows an outline of a circuit structure for performing the process.

In FIG. 9, a received signal is sent via a transmission line or the like. This received signal has been already subjected to the encoding process. There are many kinds of the encoding processes generally known. Here, explanation will be made assuming that convolutional encoding is applied.

The foregoing received signal is bifurcated so as to be inputted to the Viterbi decoding section 901 and a delaying section 902. The Viterbi decoding section 901 performs the generally known Viterbi decoding relative to the received signal. The Viterbi decoding is a process for restoring a received convolutionally encoded signal to its state before was performed. The Viterbi decoding will be described later in detail.

The signal restored at the Viterbi decoding section 901 to a state before the encoding (hereinafter referred to as the decoded signal) is outputted as is and also sent to a convolutional encoding section 903. Here, the same process as the foregoing process for generating the received signal is performed. Accordingly, an output of the convolutional encoding section 903 (hereinafter referred to as the re-encoded signal) is considered to be the same as the received signal.

On the other hand, the delaying section 902 outputs the received signal with a delay of a constant time duration. By this delay, the output timing of the re-encoded signal and that of the received signal are matched. Accordingly, the delay time at the delaying section 902 should be substantially equal to the sum of the processing time of the Viterbi decoding section 901 and the above-described convolutional encoding section 903. The delaying section 902 does not change the signal other than by delaying the time as described above.

The re-encoded signal and the delayed received signal are inputted to a comparator section 904. As described above, the input timing of both signals is matched by the effect of the delaying section 902. The comparator section 904 compares these input signals. Although the signals should coincide with each other, if a transmission error has been generated in the received signal, the signals do not coincide at a point of occurrence of the error. Depending on this non-coincident portion, the comparator section outputs an error counting output.

A circuit provided with a memory, instead of the delaying section 902, for storing the received signal is also known. In this circuit structure, the received signal stored in the memory is read out so as to match the timing with which the re-encoded signal is output. Thereafter, the comparator section compares the received signal and the re-encoded signal similarly so as to detect an error.

The technical problems incident to use of the technique disclosed in the foregoing literature are as follows:

First, the scale of the hardware increases. At the receiver side, a re-encoding circuit for performing the re-encoding process and a comparator circuit for comparing the re-encoded signal and the received signal should be provided. Further, due to the time required for the decoding and the re-encoding, the delaying section 902 or a memory as described above, becomes necessary. Thus, an increase in circuit scale can not be avoided.

Second, the number of steps to be executed is large. In the foregoing technique, an encoding process similar to that at the transmitter side and a decoding process should be executed at the receiver side. Thus, the re-encoding process, the comparison process and the like are necessary to be performed at the receiver side.

Third, if the error correction is incomplete, this influences the counting. In the foregoing technique, it is premised that the signal to which the Viterbi decoding is applied at the receiver side is a correct signal. However, there is no means provided for judging whether or not the Viterbi decoded signal itself includes an error.

Accordingly, if all errors are not corrected at the stage of Viterbi decoding so that errors remain in the decoded signal, a correct result can not be obtained also at the subsequent re-encoding stage, so that the counting of errors can not be performed accurately at the comparison stage.

SUMMARY OF THE INVENTION

In order to solve the foregoing two technical problems, in the present invention, path metric values are taken out from a metric memory normally provided in a Viterbi decoding section, the smallest value is selected from among the path metric values, and the number of errors is counted based on this smallest value.

In general, path metric value in a system for transmitting binary code is expressed by the sum of Hamming distances of paths seen in a later-described trellis figure. The Hamming distance referred to here is defined as follows: Specifically, when two code strings U and V are given by:

$U = (u1, u2, u3, \ldots, un)$ $V = (v1, v2, v3, \ldots, vn)$ a Hamming distance $d(U, V)$ between these code strings U and V is defined by:

$d(U, V) = \Sigma (u-v) \uparrow 2$ wherein an upward arrow represents the power, which will be applied likewise hereinbelow. When both code strings are binary signals, the Hamming distance is equal to the number of codes strings which differ between the two codes. Accordingly, in general, as the number of codes forming the code string increases and as a distance between codes increases, the probability of error generation is reduced.

What expresses the Hamming distance of the code strings in another form is the path metric value. Specifically, the Hamming distance between a signal string inputted to an encoder and a decoded signal string is equal to the path metric value in this system.

Accordingly, upon performing the decoding by considering that a combination of signals which renders the Hamming distance minimum is closest to a signal before the encoding, the code corresponding to this combination is determined to be a decoded signal. This is Viterbi decoding.

Accordingly, for every one-bit error in the decoded signal, the Hamming distance of the code strings is increased by one. Thus, it can be said that the increment of the Hamming distance represents the number of error bits as it is. Therefore, by storing the Hamming distance, it becomes possible to determine the number of errors.

Accordingly, in the present invention, as a method of storing the Hamming distance, a metric memory used in the normal decoder is used. To be specific, it is as follows:

Normally, when performing Viterbi decoding, an ACS operation section, a metric memory and, a path memory, and also a control section for controlling them, are used. A path metric is derived from the Hamming distance in the ACS operation section. This path metric is stored in the metric memory and the path itself giving the path metric is stored in the path memory. Then, the path which renders the path metric minimum is selected, and a signal corresponding thereto is adopted as the decoded signal.

At this time, the value of the path metric is taken out and adopted as the number of errors.

Further, when the thus derived number of errors increases to beyond a predetermined value, a process to correct the derived number of errors is performed based on an assumption that the Viterbi decoding, that led to the derived number of errors, was not performed accurately.

Further, devices that perform such a decoding process are provided both for decoding a sound signal and for decoding a well-known control signal called an FACCH signal. A signal received is inputted to both of these devices which perform the decoding processes suitable for the sound signal and the FACCH signal, respectively. The numbers of errors derived from the respective devices as the result of the decoding processes are compared to identify whether the received signal is the sound signal or the FACCH signal, and to output a correctly decoded received signal.

As advantageous effects attendant to use of the present invention, three can be enumerated first, simplification of the hardware resulting from omission of the re-encoding section, the comparator section, the delaying section and the like, second, reduction in the number of process steps to be executed resulting from the omission of the re-encoding process and the comparing process, and third, improvement in the accuracy of error counting resulting from execution of the process of correcting the number of errors when the Viterbi decoding is not correct, can be enumerated.

A fourth advantageous effect can be enumerated whether the received signal is a sound signal or an FACCH signal can be identified based on the received signal itself, simultaneously with performance of the decoding process.

DETAILED DESCRIPTION OF THE PREFERRED EMBODIMENT

Figure 1:
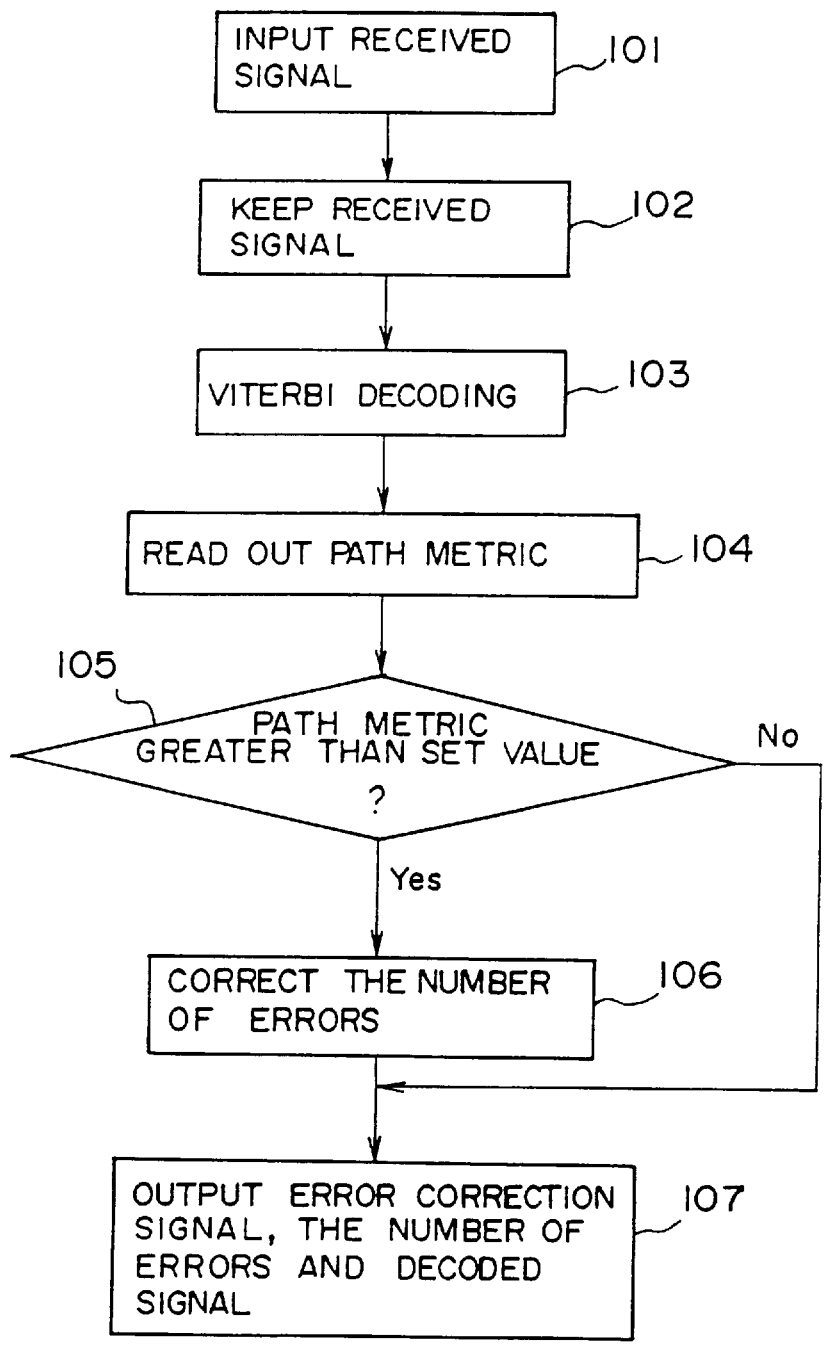
FIG. 1 is a flowchart showing an outline of a procedure according an embodiment of the invention.

Hereinbelow, a for carrying out mode of the invention which the applicant considers to be the best, will be described referring to the drawings upon occasion.

First, the principle of the Viterbi decoding will be explained. Viterbi decoding is one decoding technique. Decoding is a technique of signal conversion used in combination with encoding. In the present specification, encoding represents a method of converting a digital code or the like to be transmitted based on a specific rule in a terminal at a transmitter side in the system for transmitting the digital code or the like. On the other hand, decoding represents a method which, based on the encoded signal transmitted from the terminal at the transmitter side, derives the digital code before the encoding.

Viterbi decoding is used in combination with the convolutional encoding. The purpose of performing the encoding and the decoding before and after the transmission is to achieve an encoding gain. The encoding gain is defined by a difference between a theoretical CN ratio where the encoding for achieving a constant error rate is not performed and a CN ratio when the error correcting decoding is performed. The CN ratio represents a ratio between a carrier power of an actuating signal and a noise power. By obtaining such an encoding gain, an influence of a transmission error occurring during the transmission of the signal can be repressed. Particularly, by using convolutional encoding and Viterbi decoding, error correction can also be performed simultaneously.

As background for understanding Viterbi decoding, the process of the convolutional encoding will be first explained briefly. The convolutional code is produced by mod 2 summing of an input bit and a constant number of preceding bits. Accordingly, as shown in FIG. 3, an encoder is constituted by a shift register and an exclusive OR circuit.

Figure 3:
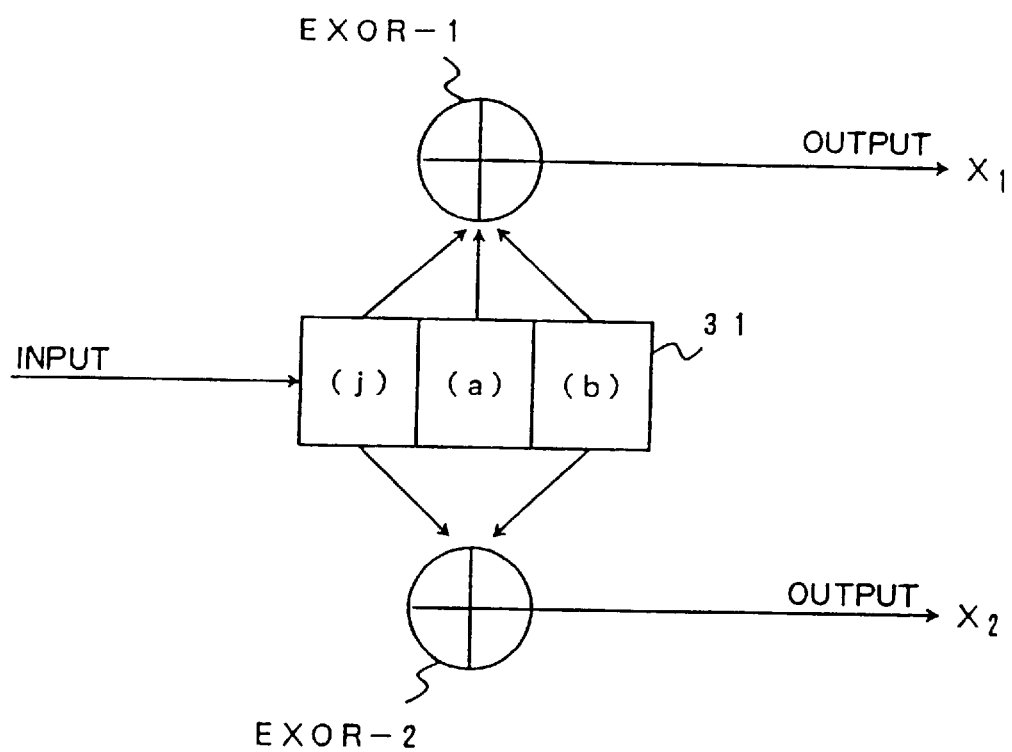
FIG. 3 is a block diagram showing a structure of an encoder with a constraint length of 3.

FIG. 3 shows a structure of an encoder having an encoding rate of ½ and a constraint length of 3. The encoding rate represents a ratio between the number of input bits and the number of output bits, and the constraint length represents the number of information bits which affect an output of the encoder. In FIG. 3, reference numeral 31 designates a 3-stage shift register having stages (j), (a) and (b). It is possible to input to the shift register 31 per one bit of the signal to be encoded.

Input data of one bit shifts data in a register (a) to a register (b) and data in the stage (j) to the stage (a), and then is stored in the stage (j).

EXOR-1 and EXOR-2 denote exclusive OR circuits. In each of the exclusive OR circuits EXOR-1 and EXOR-2, mod 2 summing is performed. Outputs X1 and X2 of the exclusive OR circuits EXOR-1 and EXOR-2 become an output of the encoder as they are. This output is called an encoded output. The encoded output is taken out every time data of one bit is inputted to the shift register 31. Accordingly, per one bit of the input data, an output of two bits in total is obtained, that is, one bit from each of X1 and X2.

Figure 4:
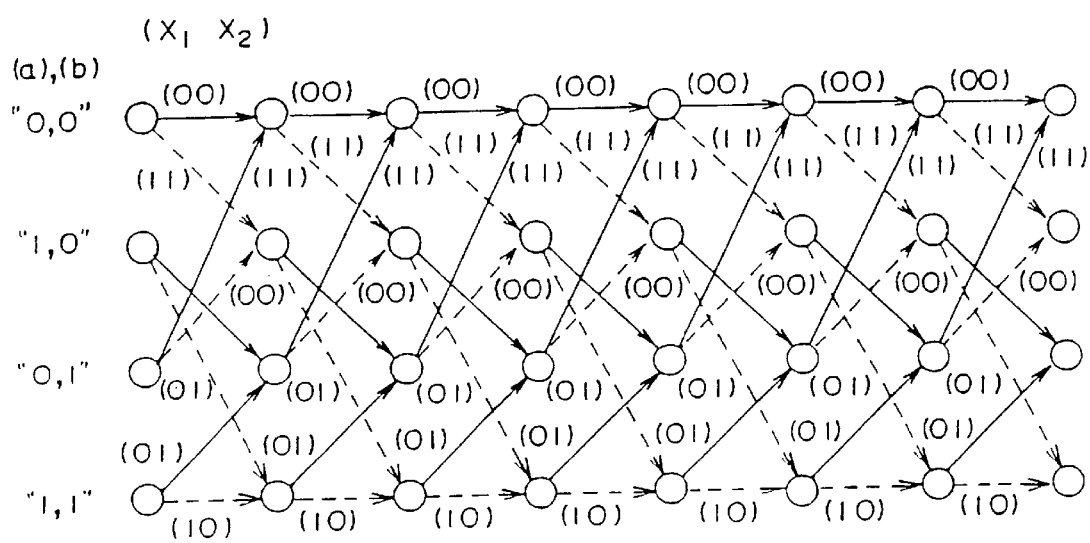
FIG. 4 is an explanatory diagram showing a trellis figure.

As a technique for conceptually expressing the process of such an encoder, there is used what is called a trellis figure. FIG. 4 shows such a trellis FIG. 7 prepared based on the structure of the foregoing encoder of FIG. 3.

In FIG. 4, lined-up circles represent possible states of the shift register 31 to be taken except for one bit of the newest input to the encoder, that is, possible states of the stages (a) and (b) to be taken. In general, in case one bit of the newest input is not included, since the shift register of the encoder has (k−1) stages, $2 \uparrow (k-1)$ states can be taken. In FIG. 3, there are four states of "0, 0", "0, 1", "1, 0" and "1, 1".

In general, the circles representing the states of the shift register are called nodes. In FIG. 4, the nodes are arranged in four rows. These four rows represent the four states of the shift register. The initial state of the register is represented by one of four nodes at a left-end column. From this condition, the state shifts to one of the nodes belonging to the adjacent right-side column, in turn every one time one bit is inputted to the encoder. When one bit is further inputted to the encoder in the state at the right end of FIG. 4, although not shown in the figure, a transition occurs similarly further rightward in the figure.

However, a transition to a state does not occur entirely arbitrarily. In FIG. 4, the transitions only occur between states connected by arrows. In FIG. 4, each arrow shown by a solid line represents a transition when "0" is inputted to the encoder, while each arrow shown by a dotted line represents a transition when "1" is inputted to the encoder. An arrow connecting between the nodes is called a branch. Each branch is assigned a peculiar value consisting of two figures, irrespective of whether the branch is shown by a solid line or a dotted line.

This two-figure value represents an output value (X1, X2) derived by executing the exclusive OR operations EXOR-1 and EXOR-2 relative to data stored in the shift register 31 of the encoder. For example, when stages (a) and (b) of the shift register 31 are in a state of "0, 1", if input data is "1", an output X1, which is the exclusive logical sum of three bits 1, 0, 1, becomes 0. On the other hand, an output X2, which is the logical sum of two bits 1, 1, becomes 0. Thus, in FIG. 4, each branch connecting the state "0, 1" to the next state "1, 0" is assigned (00).

In this manner, the process of the encoding is expressed by tracing the branches representing the transitions on the trellis figure. Specifically, by continuity of the branches, a course of the transitions can be shown continuously. This continuous course of the transitions is called a path.

The thus encoded output is transmitted from the terminal at the transmitter side to a terminal at a receiver side via a communication line or the like. At the side receiving the thus transmitted encoded output, the process called decoding is performed for deriving the same signal as the input signal which was inputted to the encoder, bit-by-bit. A typical decoding process is the foregoing Viterbi decoding. Hereinbelow, the concept and the procedure of the Viterbi decoding will be explained in detail.

Among the decoding processes, Viterbi decoding is a procedure particularly called maximum likelihood decoding. In this procedure, based on the encoded signal, several candidates of the input signal are supposed and the candidate which is considered to be the correct input signal with the highest probability is adopted as the original input signal. This procedure is characterized in that the decoding is performed based on only the encoded signal, that is, not using other signals.

Figure 2:
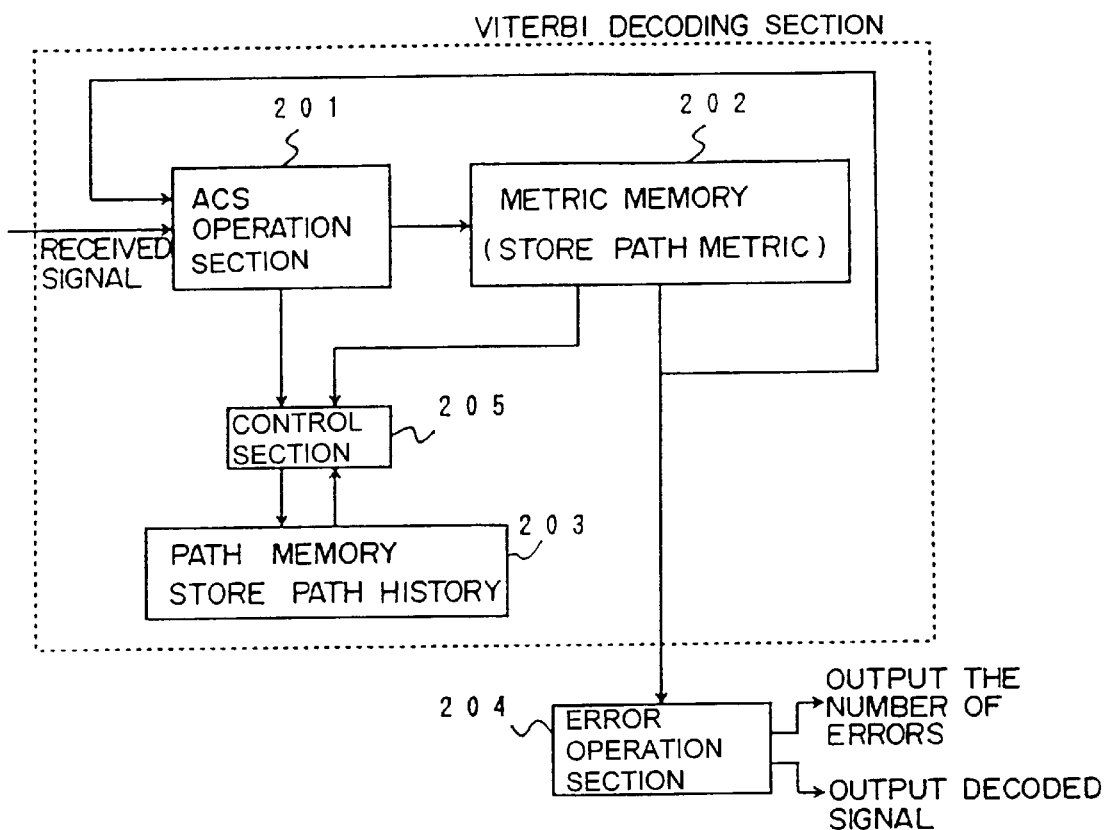
FIG. 2 is a block diagram showing a structure of a decoding section.

FIG. 2 shows an outline of a decoder 200 to be used for carrying out the present invention. In FIG. 2, the decoder 200 is constituted by an ACS operation section 201, a metric memory 202, a path memory 203 and an error operation section 204, also a control section 205 for controlling them. All of these elements of the decoder 200, except the error operation section 204 constitute a Viterbi decoding section 206. The Viterbi decoding section 206 executes all the Viterbi decoding process.

Further, FIG. 1 shows a procedure of carrying out the present invention. First, at step 101, the decoder 206 receives an encoded signal. This encoded signal is stored in a memory provided in the ACS operation section 201. Subsequently, the stored encoded signal is taken out and subjected to Viterbi decoding. During the Viterbi decoding process, a path metric is calculated. This path metric is stored in a memory, not shown, in the ACS operation section 201. Thereafter, the path metric is taken out, and is checked as to whether or not the path metric exceeds a predetermined value. Unless it exceeds the predetermined value, the path metric is itself established as the number of errors. On the other hand, if the path metric exceeds the predetermined value, another predetermined value is established to be the number of errors. Then finally, the number of errors, an error correction signal representing whether or not the path metric has itself been established as the number of errors, and a decoded signal derived after "decoding the Viterbi decoding process are outputted from the decoder.

Subsequently, the foregoing series of processes will be described in detail hereinbelow.

First, the ACS operation section 201 receives an encoded signal formed by two kinds of outputs a1' and a2' of the encoder shown in FIG. 3. Based on the received encoded signal, the ACS operation section 201 estimates the foregoing path and performs the process for restoring the signal inputted to the encoder based on this path. An implementation of this process will be described hereinbelow. Hereinafter, the received encoded signal will be simply called the received signal.

The state of the shift register of the encoder corresponding to this received signal corresponds to one of the four states in the foregoing trellis figure shown in FIG. 4. Before reaching this state, the state transitions should have been performed tracing some of the branches shown in FIG. 4 from one of the initial states at the left end in the trellis figure.

On the other hand, respective branch metrics correspond to the branches. The metrics can be derived by using a Hamming distance between codewords. Specifically, by comparing the received signal and a metric of each branch in terms of the Hamming distance, a metric per branch can be derived.

Accordingly, in the ACS operation section 201, a path metric is derived per node by summing metrics of all the branches belonging to a path which reaches the corresponding node.

Figure 5:
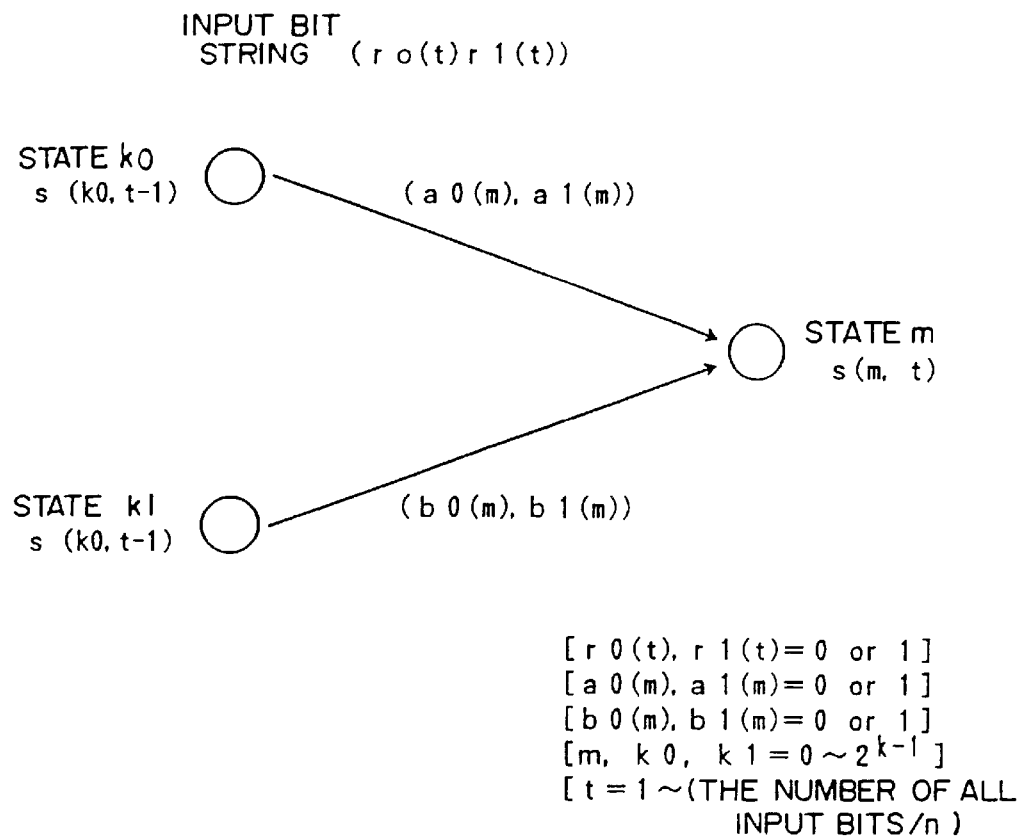
FIG. 5 is an explanatory diagram showing a trellis figure partially enlarged.

Calculation of the path metric will be described next in detail. FIG. 5 shows a part of the trellis figure of FIG. 4 on an enlarged scale. In FIG. 5, two branches for transition to a specific state m are shown. To these two branches respective bit strings (a0(m), a1(m)) and (b0(m), b1(m)) are assigned. Each of the assigned bit strings represents an encoded output outputted from the encoder when the state of the encoder shifts via the corresponding branch shown in FIG. 5. Specifically, if the state of the encoder had shifted from a state k0 to the state m, an encoded output (a0(m), a1(m)) should have been outputted in response to such a transition. Similarly, if the state of the encoder had shifted from a state k1 to the state m, an encoded output (b0(m), b1(m)) should have been outputted in response to such a transition.

On the other hand, a bit string actually received by the Viterbi decoding section 901 is set to be (r0(t), r1(t)). It is possible that this bit string differs from the actual encoded output due to inclusion of a transmission error. The transmission error represents a signal error generated in a period from the output of the encoder to the input to the Viterbi decoding section 901.

First, for a state transition corresponding to an arbitrary branch, a Hamming distance is derived relative to the actually received signal.

Calculation of the Hamming distance is executed for each branch according to the following equation:

In case of the transition from the state k0 to the state m, $$X = EXOR\{a0(m), r0(t)\} + EXOR\{a1(m), r1(t)\}$$

In case of the transition from the state k1 to the state m, $$Y = EXOR\{b0(m), r0(t)\} + EXOR\{b1(m), r1(t)\}$$

Here, EXOR {a0(m), r0(t)} represents the derived exclusive logical sum of a0(m) and r0(t). This is similar in the other terms in the foregoing equations. In this manner, by deriving the exclusive logical sum of the received signal and the branches per n bits of the received signal, the Hamming distances between the received signal and the branches can be derived. Subsequently, the Hamming distances are accumulated for the entire path composed of a series of the state transitions. This sum of the Hamming distances represents a path metric of the entire path. This operation is expressed by the following equation:

On the other hand, as the number of the input data increases per n bits (n represents an inverse number of a constraint length), the number of possible paths to be taken becomes $2\uparrow n$ times. For this reason, when the input data becomes voluminous, the number of paths becomes enormous so that it is difficult to catch the Hamming distances with respect to the received signal and all possible paths to be taken. Accordingly, every time n bits are received, of two paths reaching each node, one path which renders a path metric to the corresponding node smaller is selected as a survivor path. According to this method, it is sufficient to catch the paths of only $2\uparrow(n1-1)$ which is equal to the number of nodes. In this case, the path metric is given by:

$$sw0 = \min\{s(k0, t-1)+x, s(k1, t-1)+y\}$$

wherein s(k0, t−1) represents a path metric of the state k0 at time (t−1), and s(k1, t−1) represents a path metric of the state k1 at time (t−1).

Figure 6:
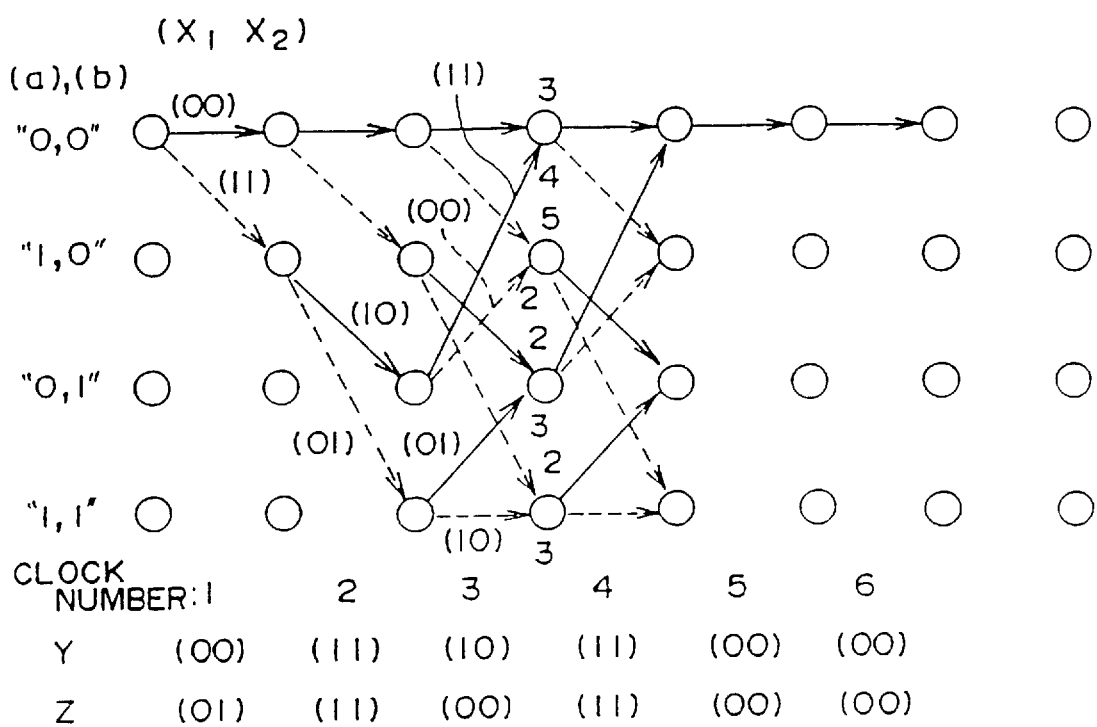
FIG. 6 is an explanatory diagram showing calculation of a path metric.

FIG. 6 shows one example of the calculation. The actually received signal is set to be Z=(00, 11, 00, 11). On the other hand, Y=(00, 11, 10, 11) corresponds to the shown paths. At this time, the technique for selecting a survivor path is adopted. This method will be described hereinbelow.

First, in the initial condition at clock numbers 1 and 2 in FIG. 6, only four paths exist. In general, when an initial value of the encoding register is determined, it is in the initial condition of the trellis figure at clock number 2 until n(k−1) bits are received. In FIG. 6, path metrics of the paths which reach the respective states are as follows:

i) When the path is "00"→"00"→"00", the path metric is 3.

ii) When the path is "00"→"10"→"01", the path metric is 2.

iii) When the path is "00"→"00"→"10", the path metric is 1.

iv) When the path is "00"→"10"→"11", the path metric is 2.

Next, in the stationary condition, at each node, the metrics of the two paths inputted to the corresponding node are compared so that the path having the smaller metric is left and the other path is excluded. Here, if the two paths have the same metric value, either one is selected arbitrarily.

A concrete example of the calculation of the path metric will be described using FIG. 6.

First, it is assumed that X=(0, 1, 0, 0) is inputted to the encoder shown in FIG. 3. At this time, an encoded output of the encoder becomes Y=(00, 11, 10, 11). It is assumed that, when this signal was transmitted to the decoding section, errors were caused at the second bit and the fifth bit so that an actually received signal became Z=(01, 11, 00, 11). In this case, the following procedure is used for calculating the path metric:

At clock number 3, there are two paths "0, 0"→"0, 0" and "0, 1"→"0, 0" which reach the state "0, 0". Path metrics of these paths become as follows:

i) 3+EXOR(00, 00)=3 ii) 2+EXOR(01, 00)=4

As a result, i) gives a smaller path metric. Based on this result, i) is adopted as a survivor path.

When processed similarly for all the states, the following four paths are selected:

"0, 0"→"0, 0"→"0, 0"→"0, 0"

"0, 0"→"1, 0"→"1, 1"→"0, 1"

"0, 0"→"1, 0"→"0, 1"→"1, 0"

"0, 0"→"0, 0"→"1, 0"→"1, 1"

Similarly, at clock number 4, paths which reach the respective states become:

"0, 0"→"0, 0"→"1, 0"→"0, 1"→"0, 0"

"0, 0"→"1, 0"→"0, 1"→"1, 0"→"0, 1"

"0, 0"→"0, 0"→"0, 0"→"0, 0"→"1, 0"

"0, 0"→"1, 0"→"0, 1"→"1, 0"→"1, 1"

As noted above, in the stationary condition, the four paths always become the survivor paths. However, finally, one path should be selected of these four paths. For this, there is a method in which the metrics of the four paths are compared so as to select the path giving the minimum path metric. However, in practice, tail bits of (k−1) bits are added after the input signal and encoded so that one path can be selected in accordance therewith.

Hereinbelow, a procedure of deriving this path metric will be described in detail.

Figure 7:
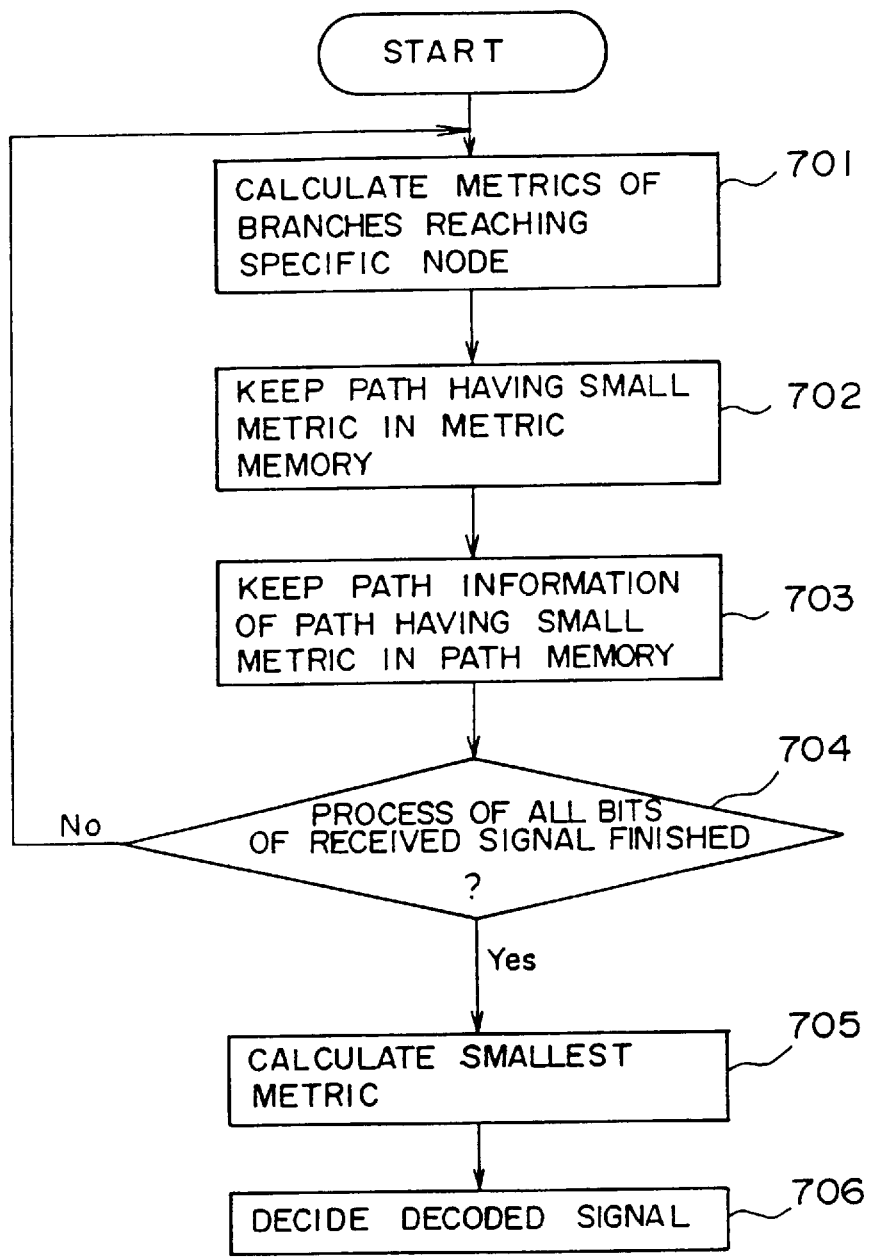
FIG. 7 is a flowchart showing a procedure for Viterbi decoding.
Figure 8:
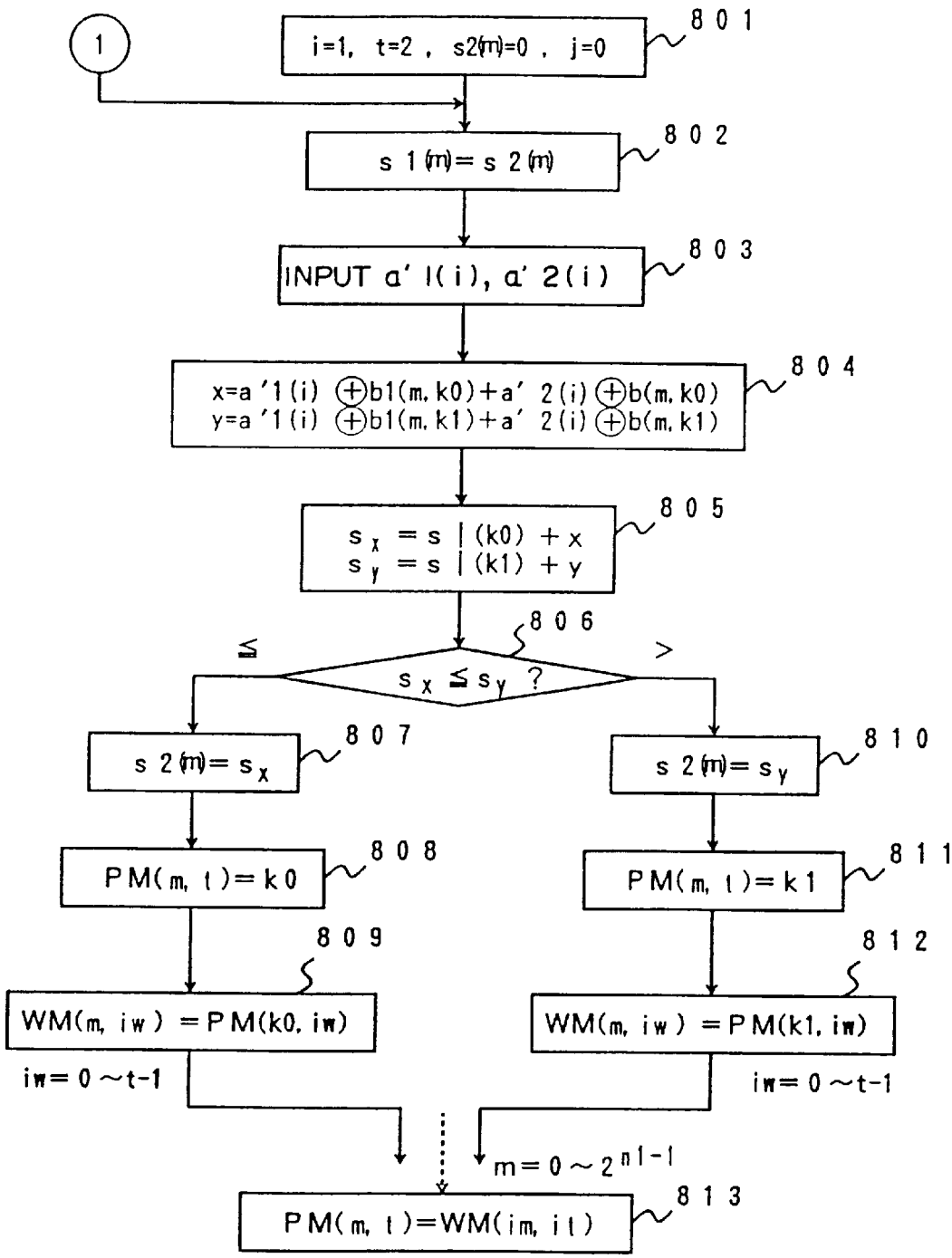
FIG. 8 is a flowchart showing details of an operation for calculation of a path metric.
Figure 9:
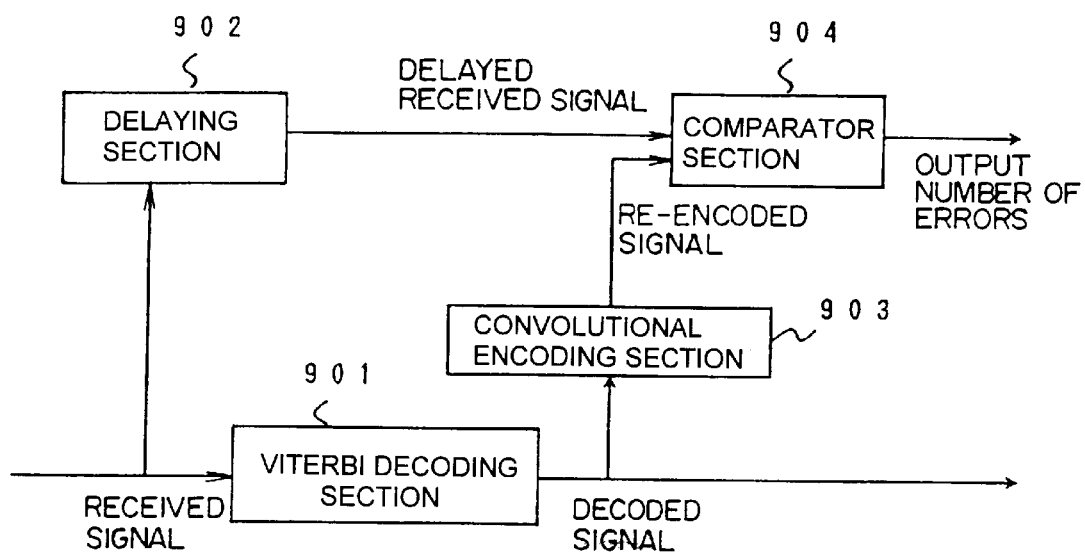
FIG. 9 is a block diagram showing a structure of a conventional error counting device.

FIG. 7 shows processes executed by the ACS operation section 201 and the control section 205. First, at steps 701 and 702, calculation of path metrics and selection of a survivor path are performed. This procedure is shown in FIG. 8.

First, at step 801, initial values are set. Here, i is a value representing a bit number of the input which corresponds to the encoded received signal, t is a value representing state transition times for a branch which is an operation object, s2(m) is a value representing a path metric of a path which reaches the state m, and j is a value representing the number of bits of a decoded signal. Subsequently, at step 802, s1(m)=s2(m).

Subsequently, at step 803, a pair of received signals a'1(i) and a'2(i) are inputted. These are signals obtained by adding errors to signals outputted from the encoder in response to the i-th bit of the signal inputted to the encoder and have one bit, respectively.

Subsequently, at step 804, an operation of the branch metrics is executed. Values of b1(m, k0), b2(m, k0), b1(m, k1) and b2(m, k1) shown in FIG. 8 can be derived by calculation called a generating function which is known to persons skilled in the art. Each of these values is either 1 or 0. By deriving the exclusive logical sums of these values and a pair of the received signals a'1(i) and a'2(i) inputted at step 802, respectively, a pair of branch metrics x and y corresponding to the i-th state transition are derived. Like in FIG. 5, k0 and k1 are values representing the respective nodes.

Next, at step 805, the derived branch metrics are added to respective path metrics corresponding to survivor paths to corresponding nodes. Here, two of path metrics to a branch corresponding to the inputted received signals a'1(i) and a'2(i) are derived. Here, the derived path metrics are always two in number. This is because there exist two branches inputted to an arbitrary node and there exists one survivor path relative to an arbitrary branch.

The survivor path referred to here is a specific path selected from all the paths including branches corresponding to the (i−1)th and preceding state transitions according to a procedure which will be described next.

Subsequently, at step 806, the two path metrics are compared. As a result of this comparison, the path having the smaller path metric is adopted as a survivor path. At step 807 or 810, the path metric adopted at step 806 is substituted for a variable s2(m) representing a path metric of a survivor path. Subsequently, at step 809 or 812, a value k0 representing the node which the survivor path transits, is substituted for a variable PM(m, t) stored in the path memory. The processes at steps 802 to 812 are repeatedly executed while m=0~2→(n1−1). Thereafter, the value PM(m, t) stored in the path memory is substituted for a variable WM(m, iw) stored in a working memory.

Thereafter, as shown at step 704 in FIG. 7, it is determined whether or not the processing of all the bits of the received signal is finished. The processes at step 704 and subsequent steps are executed at the control section 205. If the path is not converged at this stage, as a method for obtaining a decoded signal as correct as possible, the smallest metric is read out from the metric memory at step 705, and the decoded signal is decided at step 706 based on a path corresponding to the smallest metric.

After completion of this calculation, a value of the variable WM(im, it) already stored in the working memory is substituted for a variable M(m, it). The process is executed in ranges of it==0~t−1 and m=0~2→(n1−1)−1, respectively.

However, it is possible that the error contained in the received signal is not corrected completely in the process of the Viterbi decoding. For finding out whether such is the case at step 105 in FIG. 1, it is judged whether or not the already derived path metric is greater than the set value. If the path metric is greater than the set value, the decoded signal includes many errors. In this case, it is doubtful whether or not the optimum path was selected as a survivor path in the course of the foregoing decoding.

In this manner, after completion of decoding of the received signal, a value of the path metric stored in the metric memory is read out. At this time, the value of the metric memory corresponds to the foregoing optimum path. By tracing this optimum path, the decoded signal can be obtained. Accordingly, it can be said that the value of the path metric stored in the metric memory corresponds to the decoded signal. Further, since the value of the path metric is the sum of the branch metrics and each branch metric is derived by the Hamming distance between the branch and the received signal, assuming that the optimum path precisely reproduces the input signal before the encoding, it is understood that the value of the path metric is equal to the number of error bits in the received signal.

Thus, the value of the path metric is outputted as is, representing the number of errors.

On the other hand, when the number of errors exceeds the maximum number of errors which can be corrected by the Viterbi decoding, a correction process is performed, wherein a mean value of the number Nov of errors relative to the number j of the newest errors exceeding a set threshold value, that is, $$Ner=(\Sigma Nov)/j$$

is used as the number of errors. At this time, Ner is outputted from the control section instead of the value of the path metric, and the value of the path metric is rendered invalid as an output of the number of errors. This correction process is further explained below.

Further, by using the number of errors derived in the foregoing method, identification of the signal can be performed. Hereinbelow, this process will be explained.

In general, encoding methods for a sound signal and a FACCH signal differ to some degree. Accordingly, their decoding methods should inevitably also differ. When a decoding method which does not correspond to an encoding method of each signal is used upon decoding the signal, the number of errors would appear to increase. This is because, even if the received signal contains no error, since the decoding method is not proper, an accurately decoded signal can not be obtained. Accordingly, errors are generated that appear to correspond to errors in the decoded signal.

Therefore, while monitoring the number of errors, the decoding is repeatedly executed using different methods relative to the same received signal. Subsequently, the numbers of errors detected during the repeated decoding are compared. As a result of this comparison, it can be judged that the decoding method that detects less errors is a proper decoding method for the received signal. If this is performed for both a sound signal and an FACCH signal, it can be judged whether the received signal is a sound signal or an FACCH signal.

Figure 10:
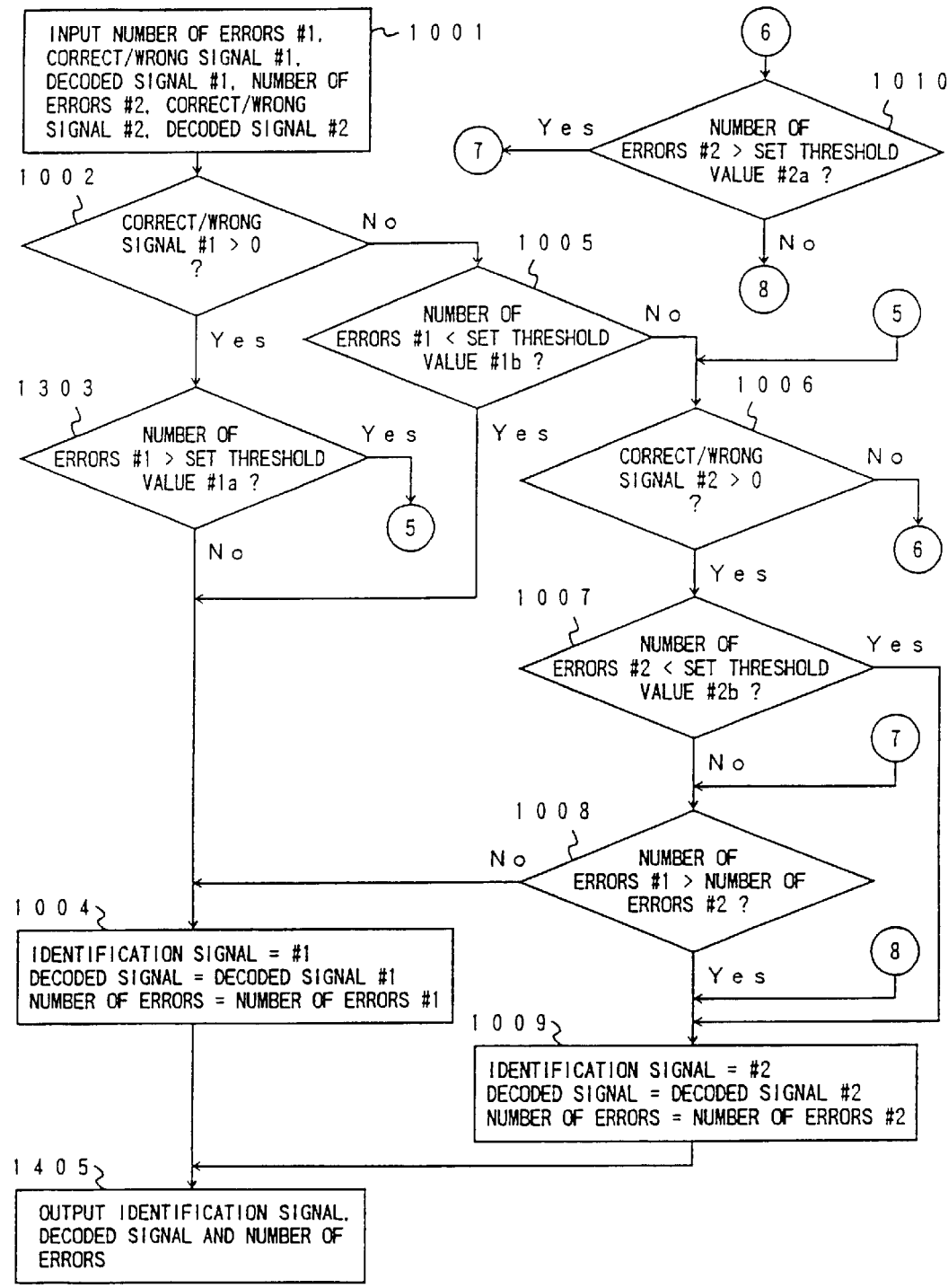
FIG. 10 is a flowchart showing a procedure for signal identification.
Figure 11:
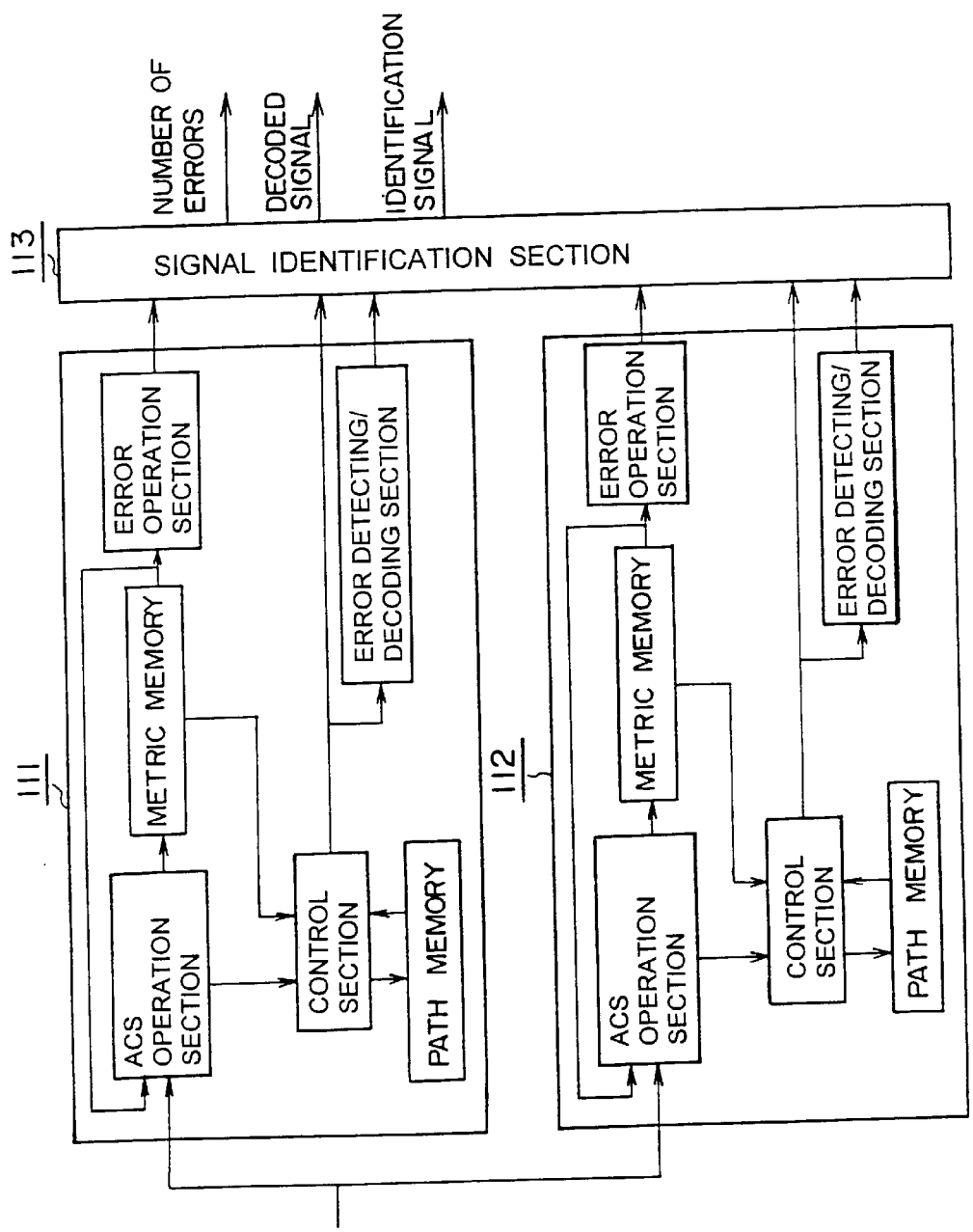
FIG. 11 is a block diagram showing a structure of a signal identification device.

FIG. 11 is a block diagram showing an outline of a structure of a signal identification device of the present invention. The signal identification device shown in FIG. 11 is constituted by three portions if roughly divided. The first is a sound signal decoding section 111, the second is an FACCH signal decoding section 112 and the third is a signal identification section 113. The subsequent processes will be described referring, in parallel, to a flowchart shown in FIG. 10 and the block diagram shown in FIG. 11.

The sound signal or the FACCH signal is inputted to the foregoing signal identification device. It is assumed that each of these signals is encoded. Further, it is assumed that, when these signals are encoded, encoding rates, constraint lengths, generating functions and the like differ between the signals. On the other hand, all of these conditions are not necessarily different. These conditions are basically determined based on a standard of the sound signal or the FACCH signal, and more specifically, based on an encoding procedure. Further, in view also of an aim of the present invention, it is sufficient that the conditions are different to such a degree that they cause a difference in the number of generated errors when the same signal is inputted. Accordingly, it is acceptable that a part of the conditions is the same at the sound signal decoding section 111 and the FACCH signal decoding section 112 as long as a difference is caused in the number of errors relative to the same signal.

This signal is simultaneously inputted to ACS operation sections provided in the sound signal decoding section 111 and the FACCH signal decoding section 112, respectively. Here, according to the foregoing method, selection of a survivor path is performed. According to this selection, the selected path is stored in the path memory 203. Substantially simultaneously with this, a value of a path metric is stored in the metric memory 202. The decoding of the signal is performed based on the record of the path memory. On the other hand, based on the record of the metric memory 202, calculation of the number of errors is executed using the foregoing method. Specifically, the sound signal decoding section 111 and the FACCH signal decoding section 112 each independently determines a survivor path and derives a Hamming distance between the survivor path and the received signal to determine a path metric, using the foregoing method. The thus obtained two kinds of the path metrics are outputted as the numbers of errors, respectively, along with decoded signals also determined independently. As a result of this, the numbers of errors differ between the sound signal decoding section 111 and the FACCH signal decoding section 112 even relative to the same signal input. This is based on the reason that the sound signal and the FACCH signal should be decoded based on procedures which differ in certain conditions, such as the encoding rates, the constraint lengths and the generating functions. Thereafter, the decoding process is performed depending on the selected survivor paths. Further, the number of errors is derived according to the values of the path metrics. Hereinbelow, details of the process will be described referring to the flowchart shown in FIG. 10.

First, at step 1001, the numbers of errors, correct/wrong signals and decoded signals, as determined by the different decoding sections are inputted as #1 and #2, respectively. These signals were supplied by the decoding processes of the different decoding sections, respectively. Here, the number of errors is a value derived according to the value of the path metric, the correct/wrong signal is a signal representing whether or not the result of error detection in FIG. 10 is correct, and the decoded signal is a signal obtained by applying the Viterbi decoding process to the received signal inputted to the ACS operation section. Here, for facilitating understanding of the explanation, #1 corresponds to the sound signal decoding section and #2 corresponds to the FACCH signal decoding section.

Subsequently, at step 1002, it is checked whether the correct/wrong signal #1 is positive. This is a process for determining whether or not the accurate decoding was performed at the sound signal decoding section. As this signal, an error detecting code specified by TIA may be used.

As a result, if the correct/wrong signal is positive, it is judged that the decoding was performed accurately. In this case, it is considered that the inputted signal is probably the sound signal. Next, at step 1003, it is checked whether the number of errors #1 exceeds a set threshold value #1a. If the number of errors #1 is no more than the set threshold value #1a, it is considered that the inputted signal may be judged to be the sound signal. At step 1004, the identification signal is set to #1, and the decoded signal #1 and the number of errors #1 are adopted as the decoded signal and the number of errors, respectively.

On the other hand, if the correct/wrong signal #1 is wrong at step 1002 or if the number of errors #1 exceeds the set threshold value #1a at step 1003, it is concluded that the decoding of the input signal was not performed accurately at the sound signal decoding section. As a cause of this, it is considered that the inputted signal was the FACCH signal. If the inputted signal is the FACCH signal, the inputted signal should be decoded accurately by the FACCH signal decoding section.

Accordingly, when the correct/wrong signal is wrong, step 1005 checks whether the number of errors #1 exceeds a set threshold value #1b. The set threshold value #1b may be set to be greater or smaller as compared with the set threshold value #1a. As a result of this, if the number of errors #1 is less than the set threshold value #1b, the identification signal is set to #1, and the decoded signal #1 and the number of errors #1 are adopted as the decoded signal and the number of errors, respectively, a step similar to the case where the correct/wrong signal #1 is positive. On the other hand, if the number of errors #1 is no less than the set threshold value #1b, step 1006 checks whether or not the correct/wrong signal #2 is positive. Further, when the number of errors #1 exceeds the set threshold value #1a at step 1003, step 1006 also checks whether or not the correct/wrong signal #2 is positive. As a result, if the correct/wrong signal #2 is positive, it is considered that the inputted signal is probably the FACCH signal. Next, at step 1010, it is checked whether the number of errors #2 exceeds a set threshold value #2a. If the number of errors #1 is no more than the set threshold value #2a, it is considered that the inputted signal may be judged to be the FACCH signal. At step 1009, the identification signal is set to #2, and the decoded signal #2 and the number of errors #2 are adopted as the decoded signal and the number of errors, respectively.

On the other hand, if the correct/wrong signal #2 is wrong at step 1006, step 1007 checks whether or not the number of errors #2 is no less than a set threshold value #2b. As a result, if the number of errors #2 is less than the set threshold value #2b, the identification signal is set to #2, and the decoded signal #2 and the number of errors #2 are adopted as the decoded signal and the number of errors, respectively, at step 1009, similar to the case where the correct/wrong signal #2 is positive.

On the other hand, if the number of errors #2 exceeds the set threshold value #2a at step 1010 or if the number of errors #2 is no less than the set threshold value #2b at step 1007, it is possible that the input signal was not decoded accurately also at the FACCH signal decoding section.

In this case, the number of errors #1 and the number of errors #2 are compared in magnitude at step 1008. Depending on the result, the identification signal, the decoded signal and the number of errors at a side with less number of errors are adopted at step 1004 or 1009. Thereafter, the process results are outputted.

The present invention is suitable for various kinds of communication devices which transmit digital signals via radio or wire transmission lines, and particularly, for a communication device which performs transmission by encoding a signal to be transmitted or decoding before and after the transmission.

I claim:

1. A signal identification device for identifying a received signal, the device comprising:
   a first decoding circuit for Viterbi decoding a signal of a first type, the first decoding circuit having
      a first calculation circuit for repeatedly calculating branch metrics of the received signal based on a first generator polynomial, and
      a first ACS circuit for selecting a first survivor path of first maximum-likelihood survivor path metrics which reflect the branch metrics calculated by the first calculation circuit;
   a second decoding circuit for Viterbi decoding a signal of a second type, the second decoding circuit having
      a second calculation circuit for repeatedly calculating branch metrics of the received signal based on a second generator polynomial, and
      a second ACS circuit for selecting a second survivor path of second maximum-likelihood survivor path metrics which reflect the branch metrics calculated by the second calculation circuit; and
   a signal-identifying circuit for identifying the received signal as a signal of the first type or a signal of the second type, based on the selected first survivor path of the last of the first maximum-likelihood survivor path metrics and the selected second survivor path of the last of the second maximum-likelihood survivor path metrics.

2. A device according to claim 1, wherein the first and second generator polynomials are different from each other.

3. A device according to claim 1, wherein the signal-identifying circuit compares a first survivor path of the last of the first maximum-likelihood survivor path metrics selected by the first ACS circuit, to a first preset value, and if the first survivor path of the last of the first maximum-likelihood survivor path metrics selected by the first ACS circuit is smaller than the first preset value, the signal-identifying circuit identifies the received signal as being of the first type, and
   wherein, if the last of the first maximum-likelihood survivor path metrics selected is not smaller than the first preset value, then the signal identifying circuit compares a second survivor path of the second maximum-likelihood survivor path metrics selected by the second ACS circuit, to a second preset value, and if the second survivor path of the last of the second maximum-likelihood survivor path metrics selected by the second ACS circuit is smaller than the second preset value, the signal identifying circuit identifies the received signal as being of the second type.

4. A device according to claim 3, wherein the first and second generator polynomials are different from each other.

5. A method of identifying a received signal, comprising:
   repeatedly calculating first branch metrics of the received signal based on a first generator polynomial;
   determining first maximum-likelihood survivor path metrics which reflect the calculated first branch metrics;
   selecting a first survivor path of the determined first maximum-likelihood survivor path metrics;
   setting the first survivor path of a last one of the determined first maximum-likelihood survivor path metrics as a first error number;
   repeatedly calculating second branch metrics of the received signal based on a second generator polynomial;
   determining second maximum-likelihood survivor path metrics which reflect the calculated second branch metrics;
   selecting a second survivor path of the determined second maximum-likelihood survivor path metrics;
   setting the second survivor path of a last one of the determined second maximum-likelihood survivor path metrics as a second error number; and
   identifying the received signal as a signal of a first type or a signal of a second type, based on the first and second error numbers.

6. A method according to claim 5, wherein the first and second generator polynomials are different from each other.

7. A method according to claim 5, wherein said identifying the received signal includes comparing the first error number to a first preset value, and if the first error number is smaller than the first preset value, then identifying the received signal as being of the first type, and
   wherein, if the first error number is not smaller than the first preset value, then comparing the second error number to a second preset value, and if the second error number is smaller than the second preset value, then identifying the received signal as being of the second type.

8. A method according to claim 7, wherein the first and second generator polynomials are different from each other.

9. A method of identifying a received signal, comprising:
   performing a first Viterbi decoding process, including
      performing a first calculation process, including calculating first branch metrics of the received signal, based on a first generator polynomial corresponding to a first type of signal, and
      performing a first metrics selection process, including successively selecting a first survivor path of first maximum-likelihood survivor path metrics which reflect the calculated first branch metrics;
   performing a second Viterbi decoding process, including
      performing a second calculation process, including calculating second branch metrics of the received signal, based on a second generator polynomial corresponding to a second type of signal, and
      performing a second metrics selection process, including successively selecting a second survivor path of second maximum-likelihood survivor path metrics which reflect the calculated second branch metrics;
   comparing the first survivor path selected during intermediate portions of the first metrics selection processes, to a first preset value;
   comparing the second survivor path selected during intermediate portions of the second metrics selection process to a second preset value;
   terminating the first decoding process and identifying the received signal as being of the second type, if the second survivor path exceeds the second preset value; and
   terminating the second decoding process and identifying the received signal as being of the first type, if the first survivor path exceeds the first preset value.

10. A method according to claim 9, wherein the first and second generator polynomials are different from each other.

11. A signal identification device for identifying a received signal, the device comprising:

a first decoding circuit for Viterbi decoding a signal of a first type, the first decoding circuit having
- a first calculation circuit for repeatedly calculating branch metrics of the received signal based on a first generator polynomial, and
- a first ACS circuit for selecting a first survivor path of first maximum-likelihood path metrics which reflect the branch metrics calculated by the first calculation circuit;

a second decoding circuit for Viterbi decoding a signal of a second type, the second decoding circuit having
- a second calculation circuit for repeatedly calculating branch metrics of the received signal based on a second generator polynomial, and
- a second ACS circuit for selecting a second survivor path of second maximum-likelihood survivor path metrics which reflect the branch metrics calculated by the second calculation circuit; and a signal-identifying circuit for identifying the received signal as a signal of the first type or a signal of the second type, and if during an intermediate portion of the decoding by the first decoding circuit the first survivor path exceeds a first preset value, then the signal-identifying circuit identifies the received signal as being the signal of the second type, and if during the intermediate portion of the decoding by the second decoding circuit the second survivor path exceeds a second preset value, then the signal-identifying circuit identifies the received signal as being the signal of the first type.

12. A signal identification device according to claim 11, wherein the signal-identifying circuit terminates decoding the received signal in the first decoding circuit if the first survivor path exceeds the first preset value.

13. A signal identification device according to claim 11, wherein the signal-identifying circuit terminates decoding the received signal in the second decoding circuit if the second survivor path exceeds the second preset value.

* * * * *